US008996972B1

(12) United States Patent
Weiner

(10) Patent No.: US 8,996,972 B1
(45) Date of Patent: *Mar. 31, 2015

(54) LOW-DENSITY PARITY-CHECK DECODER

(71) Applicant: Marvell International Ltd., Hamilton (BM)

(72) Inventor: Matthew Weiner, Northridge, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/179,179

(22) Filed: Feb. 12, 2014

Related U.S. Application Data

(63) Continuation of application No. 13/370,960, filed on Feb. 10, 2012, now Pat. No. 8,677,225.

(60) Provisional application No. 61/441,730, filed on Feb. 11, 2011.

(51) Int. Cl.
*H03M 13/00* (2006.01)
*G06F 11/00* (2006.01)
*H03M 13/11* (2006.01)

(52) U.S. Cl.
CPC .................. *H03M 13/1108* (2013.01)
USPC ........................................................ 714/800

(58) Field of Classification Search
CPC .......... H03M 13/1108; H03M 13/255; H03M 13/6513
USPC .......................................... 714/746, 800–801
See application file for complete search history.

(56) References Cited

U.S. PATENT DOCUMENTS

| | | | |
|---|---|---|---|
| 5,864,504 A | 1/1999 | Tanzawa et al. | |
| 6,016,273 A | 1/2000 | Seki et al. | |
| 6,604,222 B1 * | 8/2003 | Jensen | 714/785 |
| 7,075,827 B2 | 7/2006 | Aoyama et al. | |
| 7,313,019 B2 | 12/2007 | Giduturi et al. | |
| 7,467,253 B2 | 12/2008 | Yero | |
| 7,542,350 B2 | 6/2009 | Park et al. | |
| 7,600,177 B2 | 10/2009 | Qian et al. | |
| 7,903,462 B1 | 3/2011 | Yeung et al. | |
| 8,069,390 B2 * | 11/2011 | Lin | 714/758 |
| 8,213,228 B1 | 7/2012 | Yang | |
| 8,213,236 B1 | 7/2012 | Wu | |
| 8,495,478 B2 | 7/2013 | Liu et al. | |
| 8,677,225 B1 | 3/2014 | Weiner | |
| 2007/0089016 A1 | 4/2007 | Bhatt et al. | |
| 2010/0027350 A1 | 2/2010 | Melik-Martirosian et al. | |

OTHER PUBLICATIONS

Hung et al., A high performance multibit flipping algorithm for LDPC decoding, 2009, IEEE, p. 151-154.*
"Notice of Allowance", U.S. Appl. No. 13/370,960, Oct. 28, 2013, 8 pages.

(Continued)

*Primary Examiner* — Shelly A Chase

(57) ABSTRACT

This disclosure describes a low-density parity-check (LDPC) decoder that is configured to decode a codeword using an iterative process. The decoder includes a first syndrome memory configured to store a syndrome result determined in a previous iteration. The decoder further includes circuitry to flip bits of the codeword based on the syndrome result and one or more parity-check equations, and a second syndrome memory configured to update a current syndrome result during a current iteration based on the bits of the codeword that are flipped by the circuitry.

20 Claims, 4 Drawing Sheets

(56) References Cited

OTHER PUBLICATIONS

"Notice of Allowance", U.S. Appl. No. 12/610,106, Feb. 29, 2012, 11 pages.

"Notice of Allowance", U.S. Appl. No. 12/762,150, Mar. 19, 2012, 6 pages.

"Restriction Requirement", U.S. Appl. No. 12/610,106, Dec. 7, 2011, 5 pages.

* cited by examiner

LOW-DENSITY PARITY-CHECK DECODER

RELATED APPLICATION

This application claims priority to U.S. Utility patent application Ser. No. 13/370,960 filed Feb. 10, 2012 which in turn claims priority to U.S. Provisional Patent Application Ser. No. 61/441,730 filed Feb. 11, 2011, the disclosure of which are incorporated by reference herein in their entirety.

BACKGROUND

The Background described in this section is included merely to present a general context of the disclosure. The Background description is not prior art to the claims in this application, and is not admitted to be prior art by inclusion in this section.

A low-density parity-check (LDPC) code is a linear error correcting code that is used to transmit messages over noisy transmission channels. LDPC decoders are increasingly being utilized in flash-memory devices for error control coding. LDPC decoders use an iterative bit-flipping algorithm to decode LDPC codewords. Conventional LDPC decoders reset and re-calculate a syndrome result each iteration, which is inefficient and results in unnecessary overhead for the decoder. Further, conventional LDPC decoders must read and write to a memory whether or not bits of the codeword are flipped, which consumes a large amount of power.

SUMMARY

This summary is provided to introduce subject matter that is further described below in the Detailed Description and Drawings. Accordingly, this Summary should not be considered to describe essential features nor used to limit the scope of the claimed subject matter.

A low-density parity-check (LDPC) decoder is described that is configured to decode a codeword using an iterative process, the decoder includes a first syndrome memory configured to store a syndrome result determined in a previous, the decoder further includes circuitry to flip bits of the codeword based on the syndrome result and one or more parity-check equations, and a second syndrome memory configured to update a current syndrome result during a current iteration based on the bits of the codeword that are flipped by the circuitry.

A method is described that comprises decoding a codeword using a low-density parity-check (LDPC) decoder, the method includes determining whether to flip one or more bits of the codeword based on a syndrome result stored in a first syndrome memory, responsive to determining to flip the one or more bits of the codeword, the method includes: reading the one or more bits of the codeword from a memory, flipping the one or more bits of the codeword, saving the one or more flipped bits of the codeword to the memory to replace the one or more bits, and updating a current syndrome result stored in the second syndrome memory, or responsive to determining not to flip the one or more bits of the codeword, the method includes updating the current syndrome result stored in the second syndrome memory without reading the one or more bits of the codeword from the memory.

BRIEF DESCRIPTION OF THE DRAWINGS

The detailed description is described with reference to the accompanying figures. In the figures, the left-most digit of a reference number identifies the figure in which the reference number first appears. The use of the same reference numbers in different instances in the description and the figures indicate similar or identical items.

DETAILED DESCRIPTION

A conventional LDPC decoder is inefficient because it resets a syndrome result at the end of an iteration and must read and write to a memory whether or not bits of the codeword are flipped during the iteration. This disclosure describes an LDPC decoder that is configured to decode a codeword using an iterative process. The decoder includes a first syndrome memory configured to store a syndrome result, determined in a previous iteration. The decoder further includes circuitry to flip bits of the codeword based on the syndrome result and one or more parity-check equations, and a second syndrome memory configured to update a current syndrome result during a current iteration based on the bits of the codeword that are flipped by the circuitry. The LDPC decoder, therefore, does not need to reset each bit of the syndrome result to 0 each iteration because the second syndrome memory always contains the current syndrome result. This allows the LDPC decoder to determine that the codeword is valid at any point in time (e.g., during the current iteration) which generally results in decreasing the number of iterations used to decode the codeword by at least one-half iteration.

This disclosure also describes techniques for determining whether to flip one or more bits of a codeword based on a syndrome result stored in the first syndrome memory. When it is determined not to flip the one or more bits of the codeword, the techniques update the second syndrome memory without reading from or writing to a memory.

In the discussion that follows, an operating environment is described. A method is also described that may be employed in the operating environment as well as other environments. In the discussion below, reference will be made to the environment by way of example only and, therefore, implementations described below are not limited to the environment.

Operating Environment

Figure 1:
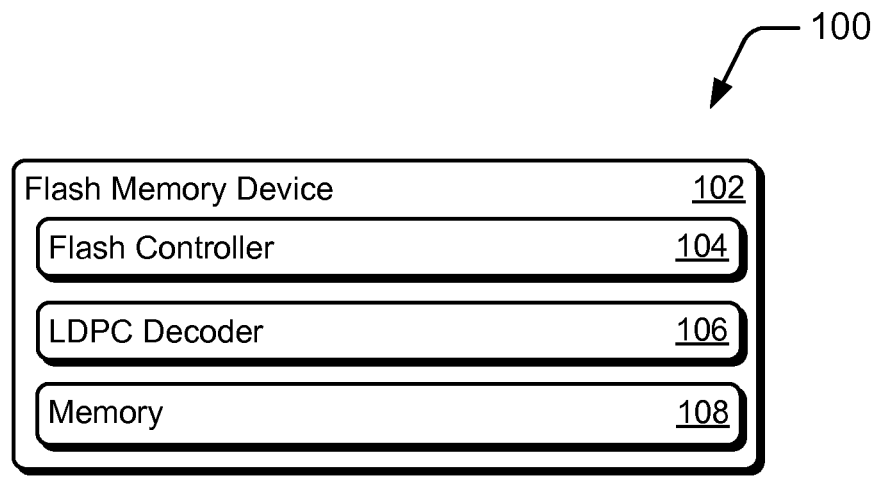
FIG. 1 illustrates an example of an operating environment.

FIG. 1 illustrates an example of an operating environment 100 in which an LDPC decoder can be implemented in a flash-memory device 102. Flash-memory device 102 includes a flash controller 104, an LDPC decoder 106, and a memory 108. Flash controller 104 controls the operation of and data communications for flash-memory device 102. LDPC decoder 106 is a hard decoder that decodes codewords stored in memory 108 based on parity-check equations and stores updated bit values in an intermediate memory. The updated bit values can then be written from the intermediate memory back into memory 108 or read out to a user. In an embodiment, the memory includes flash-memory-cell arrays that contain flash-memory cells, each cell having single or multiple levels. Each cell of flash-memory cells stores one or multiple bits of information by storing an amount of charge effective to set a voltage threshold.

While LDPC decoder 106 is illustrated as being implemented in flash-memory device 102, it is to be appreciated that the LDPC decoder may be implemented in a variety of different environments in which an LDPC decoder is used to decode LDPC codes.

Low-Density Parity-Check Decoding

Figure 2:
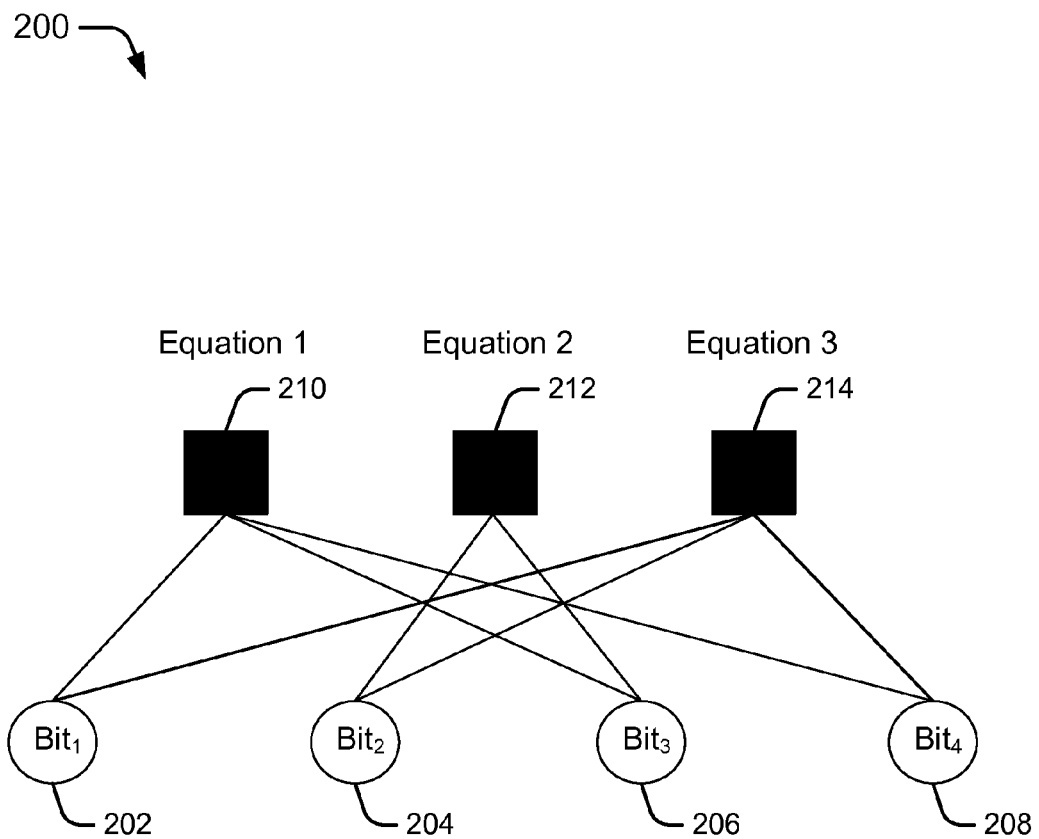
FIG. 2 illustrates an example of a factor graph for an LDPC code.
Figure 4:
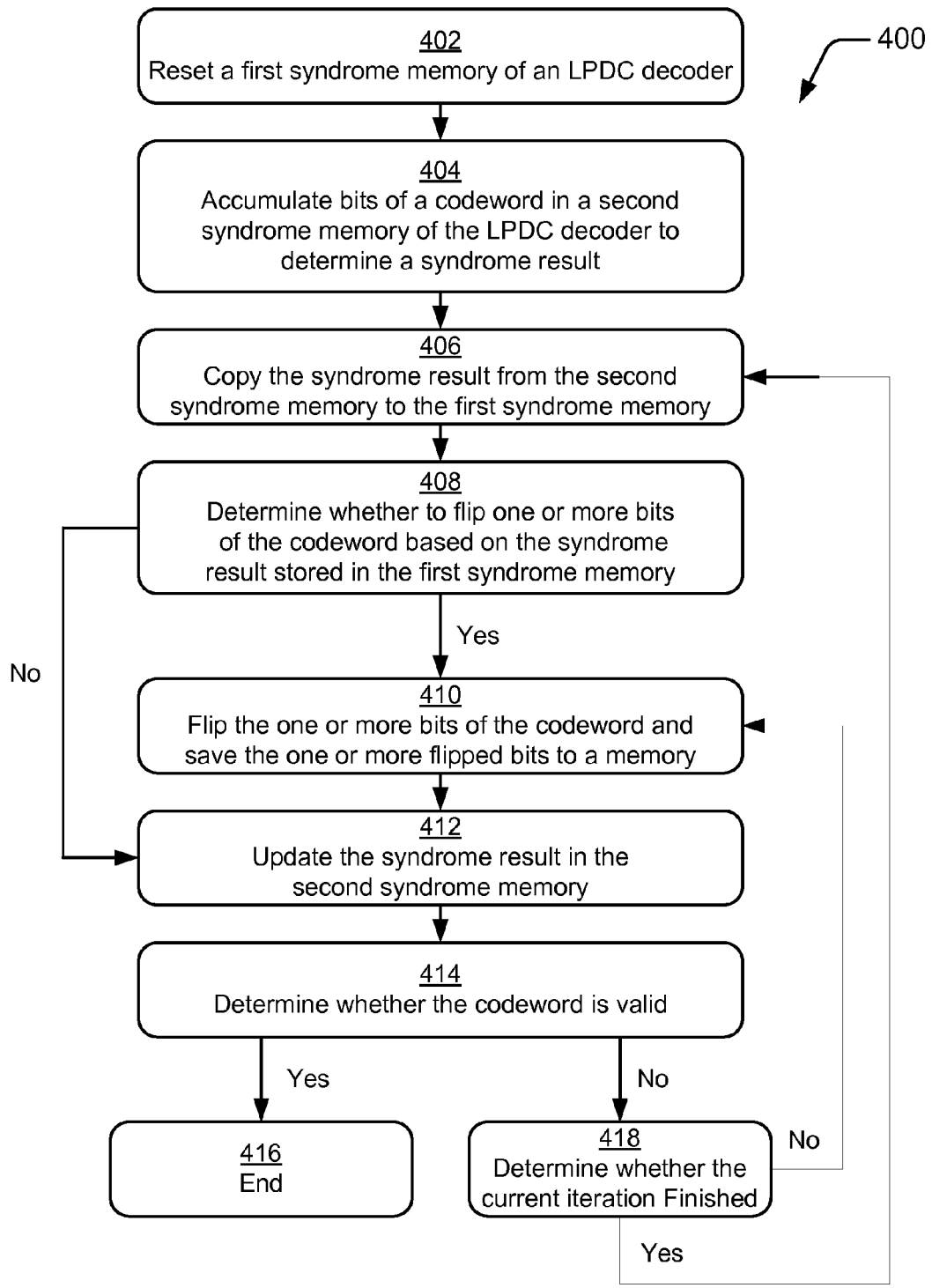
FIG. 4 illustrates a method for decoding an LDPC code using an LDPC decoder in accordance with various embodiments.

LDPC codes are defined by a sparse binary M×N parity-check matrix, which can be illustrated graphically using a factor graph where each bit has its own variable node and each parity-check has its own check node. FIG. 2 is an example of a factor graph 200 for an LDPC code. Graph 200 includes multiple bit nodes 202, 204, 206, and 208, that correspond to $Bit_1$, $Bit_2$, $Bit_3$, and $Bit_4$, respectively. The bit nodes can be connected to one or more check nodes 210, 212, and 214, that correspond to parity-check equations 1, 2, and 3, respectively. Bit nodes 202, 204, 206, and 208 correspond to bits of a valid codeword, where each bit node corresponds to one of the valid bits. Bit nodes that are connected to a common check node have even parity. In other words, the sum of the bits, modulo two, that are connected to a common check node is equal to 0. For example, valid message bits corresponding to bit nodes 202, 206, and 208 that are connected to check node 210 must sum, modulo two, to 0. The LDPC code of FIG. 2 also may be represented by the following parity-check equations:

$Bit_1+Bit_3+Bit_4=0$   Equation 1:

$Bit_2+Bit_3=0$   Equation 2:

$Bit_1+Bit_2+Bit_4=0$   Equation 3:

Additionally, the parity-check equations may be represented by a parity-check matrix where each row represents one of the parity-check constraints and each column corresponds to one of the bits. In this example, the parity-check equations can be represented by the following matrix:

1011   Equation 1:

0110   Equation 2:

1101   Equation 3:

When bits of a codeword are corrupted (e.g., during transmission through noisy communication channels), the parity-check equations are used to solve for the original bits. Solving these equations may be accomplished by a bit-flipping iterative process, such as the one illustrated in FIG. 4 and described below. As an example, consider the following codeword which satisfies all three equations: 1 0 0 1. Consider, however, that a codeword is received where $Bit_1$ is corrupted and equal to 0: 0 0 0 1. When this invalid codeword is received, it can be determined that the codeword is incorrect because the parity-check for equation 1, $Bit_1+Bit_3+Bit_4$, does not equal 0. Thus, the bit-flipping iterative process can flip $Bit_1$ from 0 to 1. Flipping $Bit_1$ satisfies equation 1 because the sum of $Bit_1$, $Bit_3$, and $Bit_4$, modulo two, is now equal to 0.

Low-Density Parity-Check Decoder

In accordance with various embodiments, an LDPC decoder is configured to decode an LDPC codeword by processing bits of the codeword according to LDPC parity-check equations. Consider for example, a codeword stored in a memory and organized in a data matrix. The LDPC decoder is configured to sum, modulo two, the bits in a row of the codeword based on the parity-check equations. When a parity-check equation is satisfied, a syndrome result is updated by storing a 0 in a syndrome memory at a location corresponding to the row of the codeword. The syndrome result is a selective sum of the bits of the codeword according to the parity-check equations. If all of the parity-check equations are not satisfied for each row of the codeword, the decoder iteratively processes the codeword by flipping bits of the codeword until the codeword is valid. The decoder flips the bits of the codeword using an iterative algorithm, that is based on the parity-check equations, to determine which bits should be flipped. After flipping one or more bits of the codeword, the LDPC decoder re-calculates the syndrome result to determine if the codeword is valid. The codeword is valid when each bit in the syndrome result is equal to 0, which indicates that the parity-check equations are satisfied for each row of the codeword.

Conventional LDPC decoders must read and write bits of the codeword from and/or to a memory even when no bits are flipped. This requires a large amount of power because the memory is generally much larger than the decoder. Further, conventional bit-flipping LDPC decoders reset each bit of the syndrome result to 0 at the end of an iteration and must recalculate the syndrome result each iteration. Conventional LDPC decoders, therefore, can only determine whether the codeword is valid at the end of the iteration.

In accordance with various embodiments, an LDPC decoder is described that does not reset the syndrome result at the end of an iteration. Instead, the LDPC decoder updates a current syndrome result based on a syndrome result from a previous iteration as bits in the codeword are flipped. The LDPC decoder, therefore, can determine that the codeword is valid during the current iteration. Additionally, the LDPC decoder, in some embodiments, only reads from and writes to the memory when a bit is flipped, which conserves power.

Figure 3:
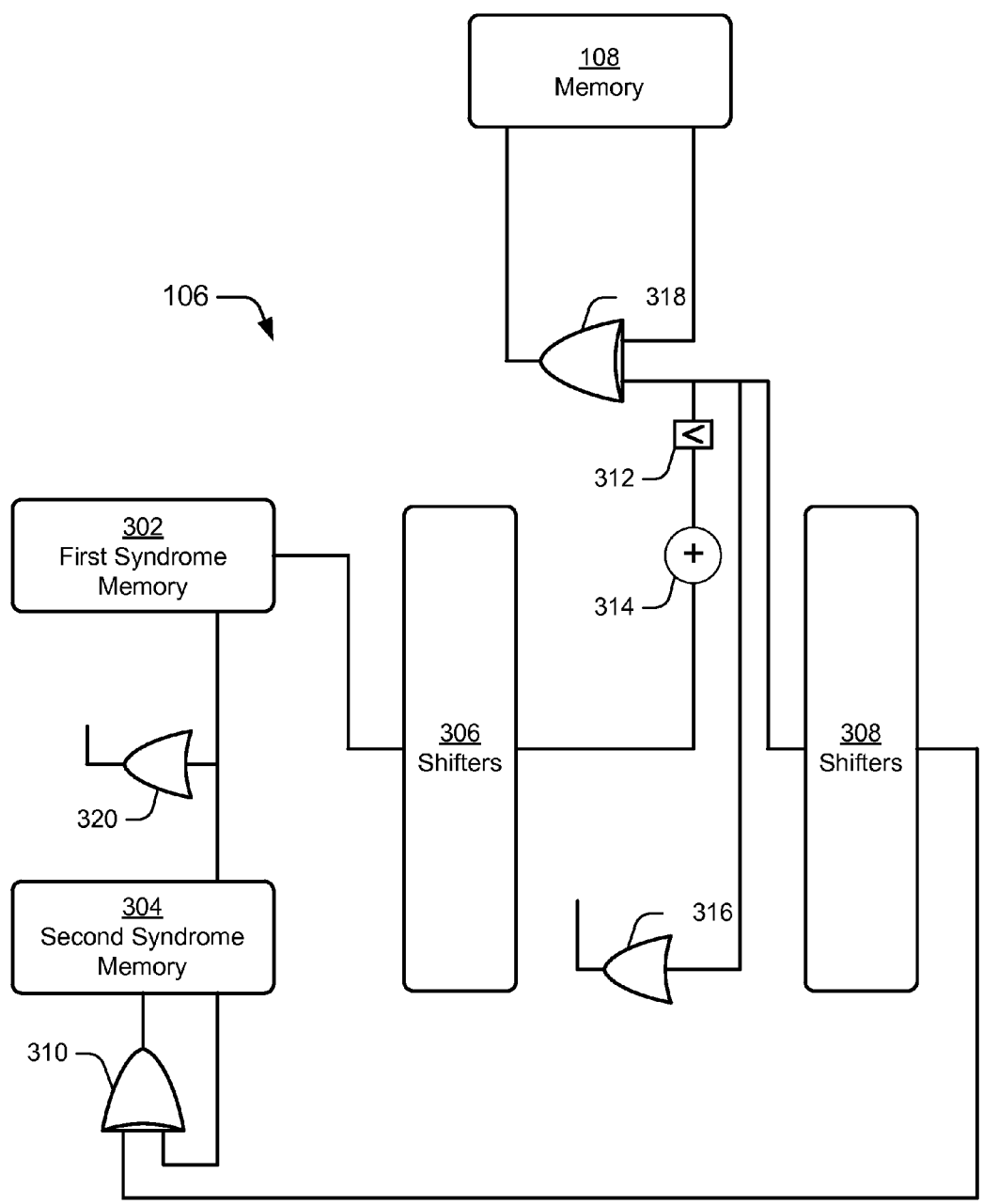
FIG. 3 illustrates a detailed example of an LDPC decoder in accordance with various embodiments.

FIG. 3 illustrates a detailed example of an LDPC decoder 106 in accordance with various embodiments. LDPC decoder 106 includes a first syndrome memory 302 that stores a syndrome result determined in a previous iteration and a second syndrome memory 304 that updates a current syndrome result during a current iteration as bits of the codeword are flipped by decoder 106. Consider now decoder 106 in view of FIG. 4, which depicts a method 400 for decoding an LDPC code using an LDPC decoder in accordance with various embodiments. Aspects of this method may be implemented in hardware, firmware, software, or a combination thereof. The method is shown as a set of acts that specify operations performed by one or more entities and are not necessarily limited to the order shown.

At 402, a first syndrome memory of an LDPC decoder is reset. For example, first syndrome memory 302 of decoder 106 is reset so that each bit of a syndrome result stored in first syndrome memory 302 is equal to 0. At 404, bits of a codeword are accumulated in a second syndrome memory of the LDPC decoder to determine a syndrome result. For example, LDPC decoder 106 loads bits of a codeword from memory 108. In an embodiment, if the LDPC code is a submatrix based code, the bits are then processed through shifter 308, which shifts the bits based on one or more parity-check equations of the LDPC code. It is to be noted, that in the first iteration only shifter 308 is used as all syndrome bits have a value of 0. The shifted bits are passed to an exclusive-or (XOR) gate 310, which performs an XOR operation on the shifted bits based on the parity-check equations.

Consider for example, parity-check equation 1 from FIG. 2, which performs an XOR (or modulo two) operation on $Bit_1$, $Bit_3$, and $Bit_4$. In this example, $Bit_1$ is passed to XOR gate 310 in a first cycle of the first iteration to update second syndrome memory 304, $Bit_3$ is passed to XOR gate 310 in a second cycle of the first iteration to update second syndrome memory 304, and $Bit_4$ is passed to XOR gate 310 in a third cycle of the first iteration to update second syndrome memory 304. This causes XOR gate 310 to perform an XOR operation on $Bit_1$, $Bit_3$, and $Bit_4$. If the result of the XOR operation is equal to 0, then a 0 will be stored in second syndrome memory 304 indicating that parity-check equation 1 was satisfied for this particular row of the codeword. Alternately, if the result of the XOR operation is equal to 1, then a 1 will be stored in second syndrome memory 304 indicating that parity-check equation 1 was not satisfied for this particular row of the codeword. It should be noted that each row of the codeword is processed according to each of the parity-check equations.

Thus, at the end of processing each row of the codeword, second syndrome memory 304 stores a current syndrome result that includes a matrix of bits with values of 1 or 0 corresponding to the result of the parity-check equations performed on each row of the codeword. If each bit in the current syndrome result in second syndrome memory 304 is equal to 0 (indicating that no data has been corrupted and the codeword is valid), then the decoding is successful and the iterative decoding process ends. Alternately, if one or more of the bits in the current syndrome result in second syndrome memory 304 is equal to 1 (indicating that data has been corrupted and the codeword is not valid), then the iterative decoding process continues to a second iteration.

At 406, a second iteration begins when the syndrome result is copied from the second syndrome memory to the first syndrome memory. For example, the syndrome result stored in second syndrome memory 304 is copied to first syndrome memory 302.

At 408, it is determined whether to flip one or more bits of the codeword based on the syndrome result stored in the first syndrome memory. As noted above, each bit in the syndrome result corresponds to a parity-check equation for a row of the codeword. Therefore, if a bit corresponding to a particular row of the codeword is equal to 1, decoder 106 flips one or more bits of the codeword corresponding to the particular row. To determine which bits to flip, the bits of the syndrome result are passed to shifters 306, which shift the bits according to iterative algorithms that are based on the parity-check equations. Such iterative algorithms are known and are not discussed in detail herein. The shifted bits are then passed to a threshold component 312 that determines whether to flip bits of the codeword. In this example, threshold component 312 receives a sum of the bits, computed via an adder 314, and compares the sum to a threshold. If the sum is greater than the threshold, then threshold component 312 outputs a flip bit with a value of 1. If the sum is not greater than the threshold, then threshold component 312 outputs a flip bit with a value of 0.

At 410, the one or more bits of the codeword are flipped and saved to a memory if it is determined that the one or more bits of the codeword are to be flipped. In this example, the flip bit computed by threshold component 312 is output to an enable control 316. The enable control is connected to memory 108 and determines whether or not data is read from and written to memory 108. For example, if the flip bit has a value of 1, indicating that a bit needs to be flipped, then enable control 316 enables reading from and writing to memory 108. Alternately, if the flip bit has a value of 0, indicating that bits do not need to be flipped, then enable control 316 disables reading from and writing to memory 108.

When reading from and writing to memory 108 is enabled, a bit-flipping component receives the one or more bits of the codeword, flips the one or more bits, and saves the one or more flipped bits to memory 108 to replace the one or more bits. In this example, the bit-flipping component is an XOR gate 318. XOR gate 318 receives the flip bit from threshold component 312 and receives one or more bits of the codeword from memory 108. XOR gate 318 then performs an XOR operation on the flip bit and the one or more bits of the codeword. Note that performing an XOR operation with the flip bit (which has a value of 1) flips the one or more bits of the codeword (e.g., from 0 to 1, or from 1 to 0). Thus, XOR gate 318 flips the one or more bits of the codeword and saves the one or more flipped bits to memory 108 to replace the incorrect one or more bits.

Continuing with the example above from FIG. 2, consider that a first row of the codeword is equal to: 0 0 0 1. As noted above, equation 1 is not satisfied in this instance because the sum of $Bit_1$, $Bit_3$, and $Bit_4$, modulo two, does not equal 0. Therefore, a value of 1 is stored in the second syndrome memory 304 for this particular row and parity-check equation. Based on this value of 1 stored in second syndrome memory 304, LDPC decoder 106 determines that $Bit_1$ needs to be flipped. Based on this determination, XOR gate 318 reads $Bit_1$ from memory 108 and flips $Bit_1$ from 0 to 1. This new flipped bit with a value of 1 is then stored in memory 108 to replace the previous bit, which had a value of 0.

Unlike conventional LDPC decoders, however, LDPC decoder 106 does not read from or write to memory 108 in each cycle. Instead, LDPC decoder 106 only writes to memory 108, in a given cycle, when it determines not to flip the one or more bits. Thus, in a given cycle, when it is determined not to flip the one or more bits, the method skips over 410. In this example, enable control 316 disables XOR gate 318 from reading from or writing to memory 108 in the given cycle when threshold component 312 determines not to flip the one or more bits of the codeword by outputting a flip bit with a value of 0. Generally, the percentage of the time that a bit needs to be flipped may be less than three percent. It is to be appreciated, therefore, that because memory reads and writes account for a majority of the power consumption of the LPDC decoder, that decreasing the number of memory reads and writes results in significant power savings for LDPC decoder 106.

Responsive to determining not to flip the one or more bits of the codeword, or concurrent with flipping the one or more bits of the codeword, at 412 the syndrome result in the second syndrome memory is updated. In this example, to update the syndrome result the flip bit calculated by threshold component 312 is passed directly to shifters 308, which pass the flip bit to XOR gate 310. XOR gate 310 then performs an XOR operation on the current syndrome result and the flip bit.

Continuing with the example from FIG. 2 above, $Bit_1$ is flipped from 0 to 1 when the flip bit is equal to 1. This flip bit is passed to XOR gate 310, which performs an XOR operation on the previous syndrome value, which is equal to 1, and the flip bit, which is also equal to 1. The result of the XOR operation, which is equal to 0, is stored in second syndrome memory 304 to replace the previous bit of the syndrome result which had a value of 1. The syndrome value of 0 indicates that parity-check equation 1 is satisfied for this particular row of the codeword.

At 414, it is determined whether the codeword is valid. The codeword is valid when each bit in the syndrome result in second syndrome memory 304 is equal to 0 indicating that each parity-check equation for each row of the codeword is satisfied. In an embodiment, a monitoring component determines whether the codeword is valid by continuously monitoring second syndrome memory 304. The monitoring component can determine that the codeword is valid during the current iteration.

In this example, the monitoring component comprises an OR gate 320 that continuously reads in each of the bits of the syndrome result from second syndrome memory 304. When each of the bits in the syndrome result are equal to 0, OR gate 320 outputs a value of 0 indicating that the codeword is valid. Alternately, a NOR gate can be used in which case when all of the bits in the syndrome result are equal to 0 the NOR gate outputs a value of 1 indicating that the codeword is valid. It is to be appreciated that because OR gate 320 continuously receives the bits of the syndrome result from second syndrome memory 304, that LDPC decoder 106 can determine that the codeword is valid at any point in time (e.g., during the current iteration) when OR gate 320 outputs a value of 0. This generally results in decreasing the number of iterations used to decode the codeword by at least one-half iteration. When it is determined that the codeword is valid, or alternately that the current iteration is finished and a maximum number of iterations is reached, the method ends at 416.

Alternately, if it is determined that the codeword is not valid (e.g., each bit of the current syndrome result in the second syndrome memory is not equal to 0), then at 418 it is determined whether the current iteration is finished. If the current iteration is not finished, then the method continues to another cycle at 410 to flip the one or more bits of the codeword. Alternately, if it is determined that the current iteration is finished, then at 406 the current syndrome result is copied from the second syndrome memory to the first syndrome memory and the iterative bit-flipping decoding process continues for a next iteration.

One or more of the techniques described above can be performed by one or more programmable processors executing a computer program to perform functions by operating on input data and generating output. Generally, the techniques can take the form of an entirely hardware embodiment, an entirely software embodiment, or an embodiment containing both hardware and software components. In one implementation, the methods are implemented in software, which includes but is not limited to firmware, resident software, microcode, etc. Furthermore, the methods can take the form of a computer program product accessible from a computer-usable or computer-readable medium providing program code for use by or in connection with a computer or any instruction execution system.

For the purposes of this description, a computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

Although the subject matter has been described in language specific to structural features and/or methodological techniques and/or acts, it is to be understood that the subject matter defined in the appended claims is not necessarily limited to the specific features, techniques, or acts described above, including orders in which they are performed.

What is claimed is:

1. A method of decoding a codeword using a low-density parity-check (LDPC) decoder, the method comprising:
storing the codeword in a memory;
storing, in a first syndrome memory, a syndrome result of the codeword determined in a previous iteration;
flipping bits of the codeword based on the syndrome result and one or more parity-check equations; and
updating a current syndrome result in a second syndrome memory during a current iteration based on the bits of the codeword that are flipped.

2. The method as recited in claim 1, further comprising:
monitoring the second syndrome memory; and
determining whether the codeword is valid based on the current syndrome result.

3. The method as recited in claim 2, wherein the determining further comprises determining whether the codeword is valid during the current iteration.

4. The method as recited in claim 2, further comprising copying the current syndrome result from the second syndrome memory to the first syndrome memory to begin a next iteration when the current iteration ends and responsive to determining that the syndrome result is not valid.

5. The method as recited in claim 2, wherein the monitoring the second syndrome memory is performed by an OR gate that is coupled to the second syndrome memory, the OR gate configured to:
monitor the second syndrome memory by receiving the current syndrome result from the second syndrome memory;
determine that the codeword is valid when each bit in the current syndrome result is equal to a first value; and
output a second value that indicates that the codeword is valid.

6. The method as recited in claim 1, further comprising determining whether to flip the one or more bits of the codeword based on the syndrome result and the one or more parity-check equations.

7. The method as recited in claim 6, further comprising outputting a flip value, the flip value having a first value responsive to determining to flip the one or more bits of the codeword, and the flip value having a second value responsive to determining not to flip the one or more bits of the codeword.

8. The method as recited in claim 6, further comprising:
reading the one or more bits of the codeword from the memory responsive to determining to flip the one or more bits of the codeword;
flipping the one or more bits of the codeword; and
saving the one or more flipped bits of the codeword to the memory to replace the one or more bits of the codeword.

9. The method as recited in claim 8, wherein the flipping the one or more bits of the codeword is performed by a an exclusive-or (XOR) gate that is configured to flip the one or more bits of the codeword by performing an XOR operation on the one or more bits of the codeword and a flip value, the flip value having a first value responsive to determining to flip the one or more bits of the codeword, and the flip value having a second value responsive to determining not to flip the one or more bits of the codeword.

10. The method as recited in claim 8, further comprising:
enabling a bit-flipping component to read the one or more bits from the memory responsive to determining to flip the one or more bits of the codeword; and
disabling the bit-flipping component from reading from the memory responsive to determining not to flip the one or more bits of the codeword.

11. The method as recited in claim 7, wherein the second syndrome memory is further configured to receive the flip value to update the current syndrome result.

12. The method as recited in claim 7, further comprising:
receiving the flip value;
performing an XOR operation on the flip value and the current syndrome result stored in the second syndrome memory; and outputting an updated current syndrome result to the second syndrome memory to replace the current syndrome result.

13. A flash memory device comprising:
a memory;
a first syndrome memory;
a second syndrome memory; and
a low-density parity-check (LDPC) decoder, the LDPC decoder configured to perform operations comprising:
   determining, in a current iteration, whether to flip one or more bits of a codeword based on a syndrome result stored in the first syndrome memory;
   responsive to determining not to flip the one or more bits of the codeword, updating a current syndrome result stored in the second syndrome memory without reading the one or more bits of the codeword from the memory.

14. The flash memory device as recited in claim 13, wherein the LPDC decoder is further configured to perform operations comprising:
   responsive to determining to flip the one or more bits of the codeword:
      reading the one or more bits of the codeword from a memory;
      flipping the one or more bits of the codeword;
      saving the one or more flipped bits of the codeword to the memory to replace the one or more bits; and
      updating the current syndrome result stored in a second syndrome memory.

15. The flash memory device as recited in claim 13, wherein the syndrome result stored in the first syndrome memory was calculated in a previous iteration.

16. The flash memory device as recited in claim 13, wherein the LPDC decoder is further configured to perform operations comprising determining whether the codeword is valid based on the updated current syndrome result stored in the second syndrome memory.

17. The flash memory device as recited in claim 16, wherein the codeword is valid when each bit in the current syndrome result stored in the second syndrome memory is equal to 0.

18. The flash memory device as recited in claim 16, wherein the LPDC decoder is further configured to perform operations comprising, responsive to determining that the codeword is not valid, beginning a next iteration by:
   copying the current syndrome result from the second syndrome memory to the first syndrome memory; and
   determining whether to flip one or more additional bits of the codeword based on the copied current syndrome result stored in the first syndrome memory.

19. The flash memory device as recited in claim 13, wherein the syndrome result and the current syndrome result contain the same values at a beginning of the current iteration.

20. The flash memory device as recited in claim 13, wherein the LPDC decoder if further configured to perform operations comprising, prior to determining whether to flip one or more bits of the codeword:
   resetting, in a previous iteration, the first syndrome memory;
   accumulating bits of the codeword in the second syndrome memory to determine the current syndrome result; and
   copying the current syndrome result from the second syndrome memory to the first syndrome memory.

* * * * *